(12) United States Patent
Lee et al.

(10) Patent No.: US 9,366,975 B2
(45) Date of Patent: Jun. 14, 2016

(54) STAGE TRANSFERRING DEVICE AND POSITION MEASURING METHOD THEREOF

(71) Applicant: Samsung Display Co., Ltd., Yongin, Gyeonggi-Do (KR)

(72) Inventors: Hi Kuk Lee, Yongin-si (KR); Sang Don Jang, Suwon-si (KR); Jae Hyuk Chang, Seongnam-si (KR); Hyang-Shik Kong, Seongnam-si (KR); Cha-Dong Kim, Seoul (KR); Chang Hoon Kim, Asan-si (KR); Jung-In Park, Seoul (KR); Sang Hyun Yun, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 135 days.

(21) Appl. No.: 13/959,864

(22) Filed: Aug. 6, 2013

(65) Prior Publication Data

US 2014/0204392 A1 Jul. 24, 2014

(30) Foreign Application Priority Data

Jan. 23, 2013 (KR) .......................... 10-2013-0007484

(51) Int. Cl.
*G01B 11/02* (2006.01)
*G03F 7/20* (2006.01)

(52) U.S. Cl.
CPC .................................. *G03F 7/70775* (2013.01)

(58) Field of Classification Search
CPC .......... G01B 7/14; G01B 11/14; G03B 27/42; G03B 27/32
See application file for complete search history.

(56) References Cited

U.S. PATENT DOCUMENTS

| 7,456,600 | B1 | 11/2008 | Yoshino | |
|---|---|---|---|---|
| 7,839,485 | B2 | 11/2010 | Shibazaki | |
| 8,134,688 | B2 | 3/2012 | Shibazaki | |
| 8,243,257 | B2 | 8/2012 | Kanaya | |
| 8,264,669 | B2 | 9/2012 | Shibazaki | |
| 8,269,945 | B2 | 9/2012 | Shibazaki | |
| 8,278,616 | B2 | 10/2012 | Sato | |
| 2007/0288121 | A1* | 12/2007 | Shibazaki | ..................... 700/213 |
| 2009/0153822 | A1 | 6/2009 | Shibazaki | |
| 2009/0268178 | A1* | 10/2009 | Shibazaki | ....................... 355/53 |
| 2010/0159403 | A1 | 6/2010 | Shibazaki | |
| 2011/0007290 | A1 | 1/2011 | Ichinose | |
| 2011/0008717 | A1 | 1/2011 | Ichinose | |
| 2011/0051108 | A1* | 3/2011 | Shibazaki | ....................... 355/53 |

FOREIGN PATENT DOCUMENTS

JP 4962780 B2 4/2012

* cited by examiner

*Primary Examiner* — Tarifur Chowdhury
*Assistant Examiner* — Jamil Ahmed
(74) *Attorney, Agent, or Firm* — Cantor Colburn LLP (57) ABSTRACT

A stage transferring device invention includes: a transferring stage upon which an object is mounted and which transfers the object in an x-y plane; and a stage position measuring device. The stage position measuring device includes a one-dimensional scale on the transferring stage; a one-dimensional scale reading head which is configured to overlap the one-dimensional scale, irradiate a measuring beam to the overlapped one-dimensional scale and measure a 1D y-axis coordinate of the transferring stage; a two-dimensional encoder on the transferring stage; and a two-dimensional encoder reading head which is configured to overlap the two-dimensional encoder, irradiate a measuring beam to the overlapped two-dimensional encoder and measure a 2D x-axis coordinate and a 2D y-axis coordinate of the transferring stage.

18 Claims, 6 Drawing Sheets

STAGE TRANSFERRING DEVICE AND POSITION MEASURING METHOD THEREOF

This application claims priority to Korean Patent Application No. 10-2013-0007484 filed on Jan. 23, 2013, and all the benefits accruing therefrom under 35 U.S.C. §119, the entire contents of which are incorporated herein by reference.

BACKGROUND (a) Field

The invention relates to a stage transferring device, and a stage position measuring method using the same. In detail, the invention relates to a stage transferring device including a stage position measuring device, and a stage position measuring method using the same.

(b) Description of the Related Art

In general, a photolithography process is widely applied as a method for forming various thin film patterns of a display panel of a display device, such as signal lines and electrodes. According to the photolithography process, a material to be patterned and a photosensitive film thereon are firstly provided (e.g., formed) on a substrate, and the photosensitive film is selectively exposed by using a photomask having a transcribing pattern corresponding to the thin film pattern. Next, a portion of the photosensitive film in which a chemical property is changed by the selective exposure or another portion of the photosensitive film is selectively removed to form a photosensitive film pattern. Next, the material to be patterned is etched by using the photosensitive film pattern as an etching mask to form the thin film pattern.

The photomask is formed with a minute pattern including a metal thin film on a transparent substrate and having a light blocking property, and the photolithography process may be applied to manufacturing the photomask as well as a thin film pattern.

This photolithography process is used in the manufacturing process of a semiconductor element as well as the display device.

In the photolithography process, an object substrate is generally mounted on a stage and the stage is moved according to any one axis to perform the exposure.

Also, a test device for testing elements of the display panel of the display device, a backlight assembly of the display device or a completed product includes the stage mounting a test object. A test light is irradiated to the test object while moving the stage of the test device, and a defect may be detected by recognizing the test light that is reflected and returns to a detector.

SUMMARY

One or more exemplary embodiment of the invention increases the precision of work performed on a working object mounted on a moving stage by correctly measuring a position of the moving stage and controlling a position of the moving stage.

A stage transferring device according to an exemplary embodiment of the invention includes: a transferring stage upon which an object is mounted and which transfers the object in an x-y plane; and a stage position measuring device. The stage position measuring device includes a one-dimensional scale on the transferring stage; a one-dimensional scale reading head which is configured to overlap the one-dimensional scale, irradiate a measuring beam to the overlapped one-dimensional scale and measure a 1D y-axis coordinate of the transferring stage; a two-dimensional encoder on the transferring stage; and a two-dimensional encoder reading head which is configured to overlap the two-dimensional encoder, irradiate a measuring beam to the overlapped two-dimensional encoder and measure a 2D x-axis coordinate and a 2D y-axis coordinate of the transferring stage.

When the one-dimensional scale reading head overlaps the one-dimensional scale and the two-dimensional encoder reading head overlaps the two-dimensional encoder, the one-dimensional scale reading head may measure a first 1D y-axis coordinate, and at substantially the same time, the two-dimensional encoder reading head may measure a first 2D x-axis coordinate and a first 2D y-axis coordinate.

When the two-dimensional encoder reading head does not overlap the two-dimensional encoder and the one-dimensional scale reading head overlaps the one-dimensional scale, the one-dimensional scale reading head may measure a second 1D y-axis coordinate of the transferring stage.

When the one-dimensional scale reading head overlaps the one-dimensional scale and the two-dimensional encoder reading head overlaps the two-dimensional encoder, the stage position measuring device may set the first 2D y-axis coordinate measured by the two-dimensional encoder reading head equal to the first 1D y-axis coordinate measured by the one-dimensional scale reading head or set the first 1D y-axis coordinate measured by the one-dimensional scale reading head equal to the first 2D y-axis coordinate measured by the two-dimensional encoder reading head.

Differences between the first 1D y-axis coordinate of the one-dimensional scale reading head and the first 2D y-axis coordinate of the two-dimensional encoder reading head may be measured several times, and an average value of the differences may be used when the stage position measuring device sets the first 2D y-axis coordinate equal to the first 1D y-axis coordinate or sets the first 1D y-axis coordinate equal to the first 2D y-axis coordinate.

The stage transferring device may further include a laser interferometer which measure a position of the transferring stage.

The laser interferometer may include: a y-axis bar-shaped mirror at a first edge side of the transferring stage, the first edge side elongated in the x-axis direction; and a y-axis interferometer laser head which corresponds to the y-axis bar-shaped mirror and measures an absolute y-axis coordinate.

The laser interferometer may further include: an x-axis bar-shaped mirror at a second edge side of the transferring stage, the second edge side elongated in the y-axis direction; and an x-axis interferometer laser head which corresponds to the x-axis bar-shaped mirror and measures an absolute x-axis coordinate.

The stage position measuring device may reset the first 1D y-axis coordinate of the one-dimensional scale reading head and the first 2D y-axis coordinate of the two-dimensional encoder reading head to the absolute y-axis coordinate.

The transferring stage may include a rotation center at a geometric center thereof; a distance between an approximate center of the one-dimensional scale reading head and the rotation center may be referred to as a first distance d1, a distance between the two-dimensional encoder reading head and the rotation center may referred to as a second distance d2, an angle formed by the approximate center of the one-dimensional scale reading head with respect to the x-axis direction may be referred to as a first angle θ1, and an angle formed by the two-dimensional encoder reading head with respect to the x-axis direction may be referred to as a second angle θ2, and d2 (sin θ2) may be equal to d1 (sin θ1) when the two-dimensional encoder reading head overlaps the two-dimensional encoder.

A position measuring method of a stage according to an exemplary embodiment of the invention includes: mounting a working object on a transferring stage; measuring a 1D y-axis coordinate of the transferring stage by a one-dimensional scale on the transferring stage and a one-dimensional scale reading head overlapping the one-dimensional scale; and measuring a 2D x-axis coordinate and a 2D y-axis coordinate of the transferring stage by a two-dimensional encoder on the transferring stage and a two-dimensional encoder reading head overlapping the two-dimensional encoder.

When the two-dimensional encoder and the two-dimensional encoder reading head overlap each other, the one-dimensional scale reading head may measure a first 2D y-axis coordinate, and at the same time, the two-dimensional encoder reading head may measure a first 2D x-axis coordinate and a first 2D y-axis coordinate.

When the two-dimensional encoder reading head does not overlap the two-dimensional encoder, the one-dimensional scale reading head may measure a second 2D y-axis coordinate of the transferring stage.

The method may further include setting the first 2D y-axis coordinate of the two-dimensional encoder reading head to be equal to the first 1D y-axis coordinate of the one-dimensional scale reading head or setting the first 1D y-axis coordinate of the one-dimensional scale reading head equal to the first 2D y-axis coordinate of the two-dimensional encoder reading head, when the one-dimensional scale reading head overlaps the one-dimensional scale and the two-dimensional encoder reading head overlaps the two-dimensional encoder.

Differences between the first 1D y-axis coordinate of the one-dimensional scale reading head and the first 2D y-axis coordinate of the two-dimensional encoder reading head may be measured several times, and an average value of the differences may be used when the stage position measuring device sets the first 2D y-axis coordinate equal to the first 1D y-axis coordinate or sets the first 1D y-axis coordinate equal to the first 2D y-axis coordinate.

The method may further include periodically measuring a position of the transferring stage by using a laser interferometer.

The laser interferometer may include: a y-axis bar-shaped mirror at a first edge side of the transferring stage, the first edge side elongated in the x-axis direction; and a y-axis interferometer laser head which corresponds to the y-axis bar-shaped mirror and measures an absolute y-axis coordinate.

The laser interferometer may further include an x-axis bar-shaped mirror at a second edge side of the transferring stage, the second edge side elongated in the y-axis direction; and n x-axis interferometer laser head which corresponds to the x-axis bar-shaped mirror and measures an absolute x-axis coordinate.

The method may further include resetting the first 1D y-axis coordinate of the one-dimensional scale reading head and the first 2D y-axis coordinate of the two-dimensional encoder reading head with the absolute y-axis coordinate.

The transferring stage may include a rotation center at a geometric center thereof. A distance between an approximate center of the one-dimensional scale reading head and the rotation center may be referred to as a first distance d1, a distance between the two-dimensional encoder reading head and the rotation center may be referred to as a second distance d2, an angle formed by the approximate center of the one-dimensional scale reading head with respect to the x-axis direction may be referred to as a first angle θ1, and an angle formed by the two-dimensional encoder reading head with respect to the x-axis direction may be referred to as a second angle θ2, and d2 (sin θ2) may be equal to d1 (sin θ1) when the two-dimensional encoder reading head faces the two-dimensional encoder.

According to one or more exemplary embodiment of the invention, the position of the moving stage may be accuracy measured and controlled thereby increasing work precision for the work object on the stage.

BRIEF DESCRIPTION OF THE DRAWINGS

The above and other features of the disclosure will become more apparent by describing in further detail exemplary embodiments thereof with reference to the accompanying drawings, in which.

DETAILED DESCRIPTION

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention. In the drawings, the size and relative sizes of layers and regions may be exaggerated for clarity.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "under" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A thin film manufacturing process or a test process of an electronic device such as a semiconductor element and a display device, includes a process of moving a stage after mounting a substrate or a test object on the stage. If a position of the moving stage is not correct because of an error of a driving device or various environmental factors, an error is generated in the thin film manufacturing process or the test process such that the quality of the manufactured or tested product may be deteriorated.

To control a position of the moving stage, a laser interferometer may be used. The laser interferometer may detect the position of the stage through a laser beam that is irradiated to and reflected from a bar mirror attached to the stage. However, the laser interferometer may cause an error of a measuring value according to an external influence such as a pressure, a temperature and/or an environmental factor such as air current. Particularly, when moving the stage relatively quickly, the measuring error value is further increased and reliability of the manufactured product or the test result may be further decreased.

Hereinafter, the invention will be described in detail with reference to the accompanying drawings.

Now, exemplary embodiments of a stage position measuring device and a stage transferring device including the same according to the invention will be described with reference to accompanying drawings.

Firstly, an exemplary embodiment of a stage position measuring device and a stage transferring device including the same according to the invention will be described with reference to FIG. 1 and FIG. 2.

Figure 1:
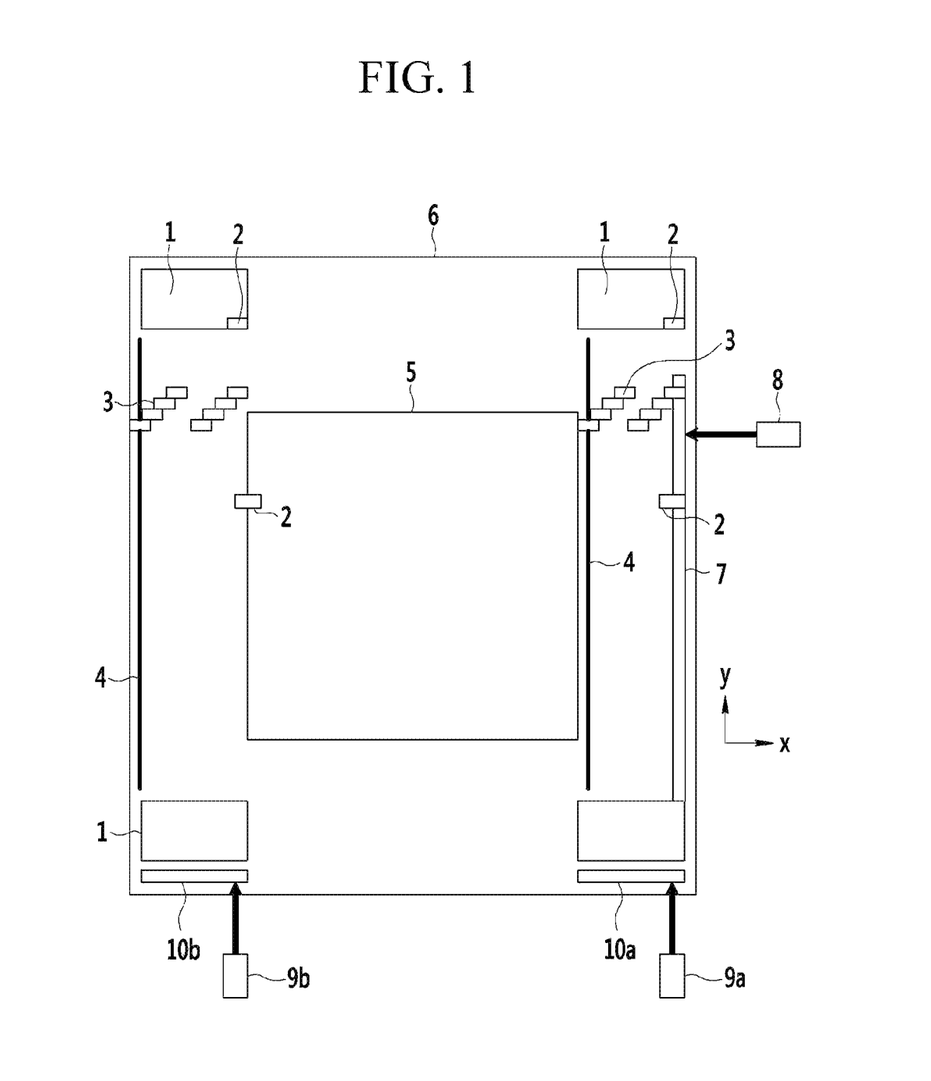
FIG. 1 is a top plan view of an exemplary embodiment of a stage position measuring device of a stage transferring device according to the invention.
Figure 2:
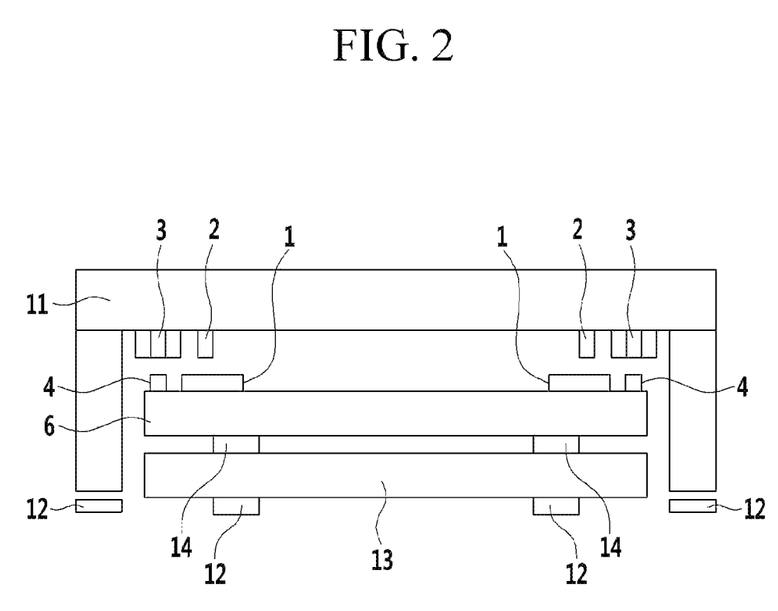
FIG. 2 is a lateral cross-sectional view of the stage position measuring device according to the invention.

FIG. 1 is a top plan view of an exemplary embodiment of a stage position measuring device of a stage transferring device according to the invention, and FIG. 2 is a lateral cross-sectional view of the stage position measuring device according to the invention.

Referring to FIG. 1 and FIG. 2, an exemplary embodiment of a stage transferring device according to the invention includes a transferring stage 6 and a stage position measuring device.

The transferring stage 6 mounts and supports a working object upon which work is to be performed such as manufacturing or testing of the object, and may transfer (e.g., move between different positions) the working object. The transferring stage 6 may hereinafter be simply referred to as a stage. FIG. 1 shows a working object 5 fixed on the transferring stage 6.

The transferring stage 6 may be positioned on a base frame 13 having a substantially plate shape. An air bearing 14 may be positioned between the base frame 13 and the transferring stage 6. The air bearing 14 utilizes high-pressure air, reduces a moving resistance of the transferring stage 6, and may reduce or effectively prevent abrasion of a bottom surface of the transferring stage 6.

At least one isolator 12 may be positioned under the base frame 13. The isolator 12 absorbs vibration that may be transmitted from a bottom surface upon which the base frame 13 is positioned such that the influence of the vibration is not transmitted to the transferring stage 6 via the base frame 13.

Also, an exemplary embodiment of the stage transferring device according to the invention may further include a y-direction driving guide (not shown) and a y-direction driving stage (not shown) to move the transferring stage 6 in a y-direction, and/or a θ-direction driving stage (not shown) which rotates and drives the working object on the base frame 13 to compensate a twisted state of the working object.

The exemplary embodiment of the transferring stage 6 according to the invention may be moved in an x-y plane. The transferring stage 6 may be moved through a stepped operation in the x-axis direction, e.g., not continuous displacement, and may be substantially continuously moved through a scanning operation in the y-axis direction. However, the invention is not limited thereto or thereby.

Also, the transferring stage 6 may be supported by several methods different from as shown in FIG. 2.

The exemplary stage position measuring device according to the invention includes at least one two-dimensional ("2D") encoder 1, at least one 2D encoder reading head 2, at least one one-dimensional ("1D") scale reading head 3 and at least one 1D scale 4.

The 2D encoder 1 and the 1D scale 4 are positioned on the transferring stage 6. The 2D encoder reading head 2 and the 1D scale reading head 3 are on a separate support 11 and may be maintained in a fixed position relative to the transferring stage 6.

At least one isolator 12 may be further positioned between the bottom surface upon which the stage transferring device is positioned, and the support 11.

In the exemplary embodiment of the stage transferring device according to the invention, the support 11 is maintained in a fixed position and the transferring stage 6 moves relative to the support 11 such as downward and away from the support 11. With movement of the transferring stage 6 away from the support 11, the working object may be exposed and irradiated with light such as with a laser beam for performing work such as manufacturing or testing of the work object 5.

The 2D encoder 1 may include a 2D diffraction lattice and/or 2D graduations used to measure a 2D position of the transferring stage 6 in the x-y plane of the transferring stage 6. When the 2D encoder reading head 2 overlaps the 2D encoder 1, a measuring beam is irradiated to the 2D encoder 1 and 2D coordinates of the transferring stage 6 may be obtained in the x-y plane of the transferring stage 6 through a beam which is reflected by the 2D encoder 1.

In the plan view, an x-axis direction length or a y-axis direction length of the 2D encoder 1 may be about several tens of centimeters for use in the manufacturing process, but is not limited thereto.

The 2D encoder 1 may be positioned in at least one region adjacent to an outer edge of the transferring stage 6, such as a region among four corners adjacent to the edge of the transferring stage 6.

The 2D encoder reading head 2 is fixed at a position such that it may overlap the 2D encoder 1 according to the position in the y-axis direction with respect to the support 11. The 2D encoder reading head 2 may obtain the 2D coordinates of the transferring stage 6 in the x-y plane of the transferring stage 6 through the beam that is reflected by and returned from the 2D encoder 1 after the measuring beam is irradiated to the 2D encoder 1.

Each 2D encoder 1 corresponds to one 2D encoder reading head 2, but is not limited thereto. Referring to the plan view of FIG. 1, the 2D encoder reading head 2 positioned above the 1D scale reading head 3 (e.g., at the top of the transferring stage 6) may overlap or face the 2D encoder 1 positioned towards the top of the transferring stage 6. The 2D encoder reading head 2 positioned below the 1D scale reading head 3 (e.g., at the right edge of the transferring stage 6 or shown overlapping the working object 5) may face the 2D encoder 1 positioned towards the bottom of the transferring stage 6.

The 1D scale 4 may include a 1D diffraction lattice and/or 1D graduations to measure the position in the y-axis direction of the transferring stage 6, that is, the y-axis coordinate. When the 1D scale reading head 3 overlaps the 1D scale 4, a measuring beam is irradiated to the 1D scale 4 and the coordinate of the y-axis direction of the transferring stage 6 may be obtained through the beam reflected back to the 1D scale reading head 3 from the 1D scale 4.

The 1D scale 4 may be positioned adjacent to the edge of the transferring stage 6 and be elongated to extend in the y-axis direction of the transferring stage 6.

The 1D scale reading head 3 is fixed at a position such that it may overlap the 1D scale 4 according to the position of the transferring stage 6 in the y-axis direction with respect to the support 11. The 1D scale reading head 3 may obtain the 1D coordinate of the transferring stage 6 in the y-axis direction through the beam that is reflected by and returned from the 1D scale 4 after the measuring beam is irradiated to the 1D scale 4.

The 1D scale reading head 3 corresponding to one 1D scale 4 may be provided in plural, as illustrated in FIG. 1 and FIG. 2. Accordingly, when the x-axis direction position of the transferring stage 6 is changed such that the x-axis direction position of the 1D scale 4 is changed, a 1D scale reading head 3 of the plurality of 1D scale reading heads 4 which overlaps and faces the 1D scale 4 may be used to perform the y-axis coordinate measurement. That is, the 1D scale 4 used to obtain the y-axis coordinate measurement may be changed during the manufacturing and/or test process.

A plurality of 1D scale reading heads 3 may include at least one group of 1D scale reading heads 3 arranged approximately in the y-axis direction. FIG. 1 and FIG. 2 show an example in which a plurality of 1D scale reading heads 3 include two groups of 1D scale reading heads 3. Within a group of 1D scale reading heads 4, geometric centers of the 1D scale reading heads 3 adjacent in the x-axis direction may be separated by a predetermined interval taken along the x-axis direction indicated in FIG. 1 and FIG. 2. That is, in the x-axis direction, the adjacent 1D scale reading heads 3 may be in fixed positions to be adjacent to each other while overlapping each other in the x-axis direction.

The 1D scale 4 and the 1D scale reading head 3 may measure the coordinate of the y-axis direction and may simultaneously measure the position of the y-axis direction in a very short range within several millimeters.

With reference to the plan view of FIG. 1, at least one y-axis bar mirror 10a and 10b may be attached at an upper or a lower edge side of the transferring stage 6. The term "bar" refers to the planar shape of the mirror 10a and 10b, that is, an elongated and relatively uniform thickness shape. The y-axis bar mirrors 10a and 10b reflect the laser beam irradiated from y-axis interferometer laser heads 9a and 9b respectively corresponding thereto, and the y-axis interferometer laser heads 9a and 9b may determine the position of the transferring stage in the y-axis direction through the beam reflected by and returned from the y-axis bar mirrors 10a and 10b. Particularly, when the transferring stage 6 is moved in the y-axis direction, the transferring stage 6 may be rotated in the x-y plane such that a left position and a right position of the side edges elongated to extend approximately in the x-axis direction among the edge side of the transferring stage 6 may be changed. To measure the position change of the transferring stage 6, as shown in FIG. 1 and FIG. 2, a pair of y-axis bar mirrors 10a and 10b and a pair of y-axis interferometer laser heads 9a and 9b may be installed at the left side and the right side at the upper and lower sides of the transferring stage 6, in the plan view.

At least one x-axis bar mirror 7 may be attached at the left or right edge sides of the transferring stage 6, in the plan view. Again, the term "bar" refers to the planar shape of the mirror 7, that is, an elongated and relatively uniform thickness shape. The x-axis bar mirror 7 reflects the laser beam irradiated from a corresponding x-axis interferometer laser head 8, and the x-axis interferometer laser head 8 may detect the position in the x-axis direction of the transferring stage 6 through the beam reflected by and returned from the x-axis bar mirror 7.

The x-axis bar mirror 7 and the x-axis interferometer laser head 8 or the y-axis bar mirrors 10a and 10b and the y-axis interferometer laser heads 9a and 9b may together referred to as a laser interferometer.

The y-axis interferometer laser heads 9a and 9b and the x-axis interferometer laser head 8 may detect the position of the transferring stage 6 by using interference of the laser light.

Next, an exemplary embodiment of a stage position measuring method using a stage position measuring device according to the invention will be described with reference to FIG. 3 and FIG. 4 along with FIG. 1 and FIG. 2.

Figure 3:
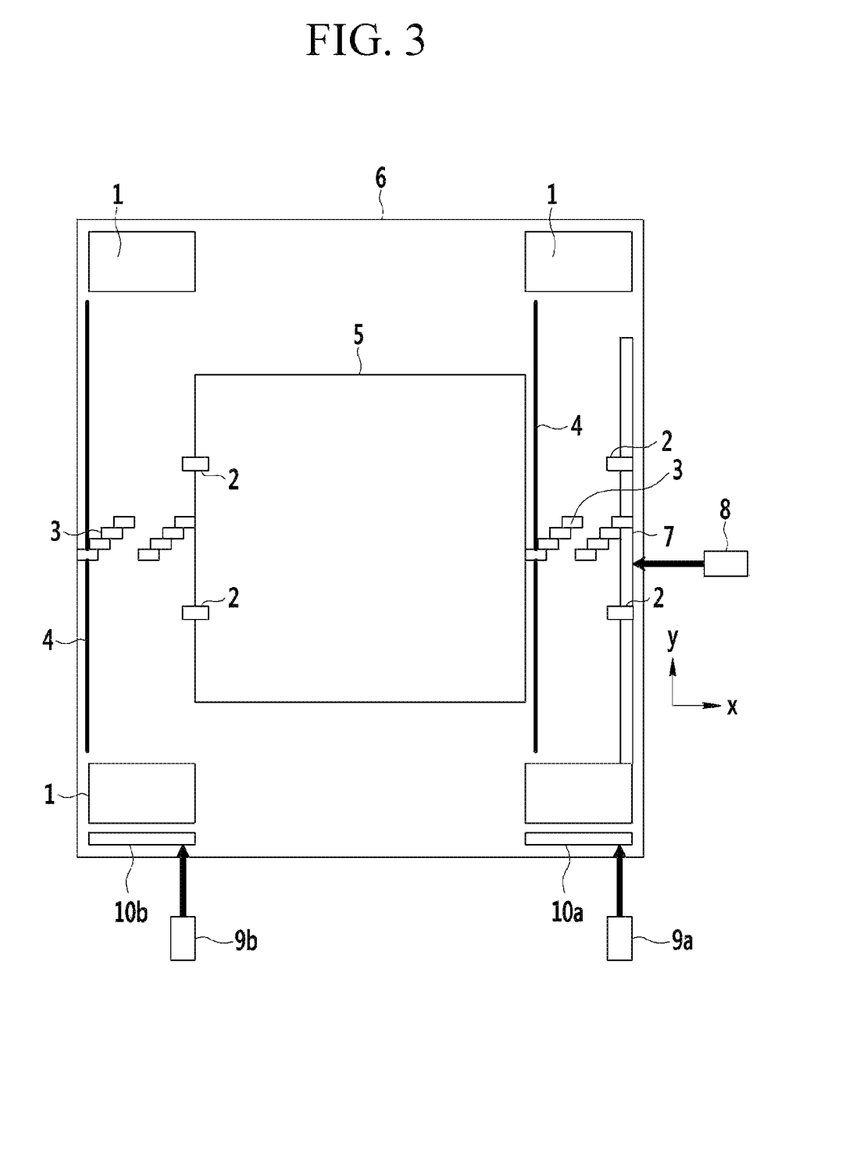
FIG. 3 and FIG. 4 are top plan views of an exemplary embodiment of a stage position measuring method according to the invention.
Figure 4:
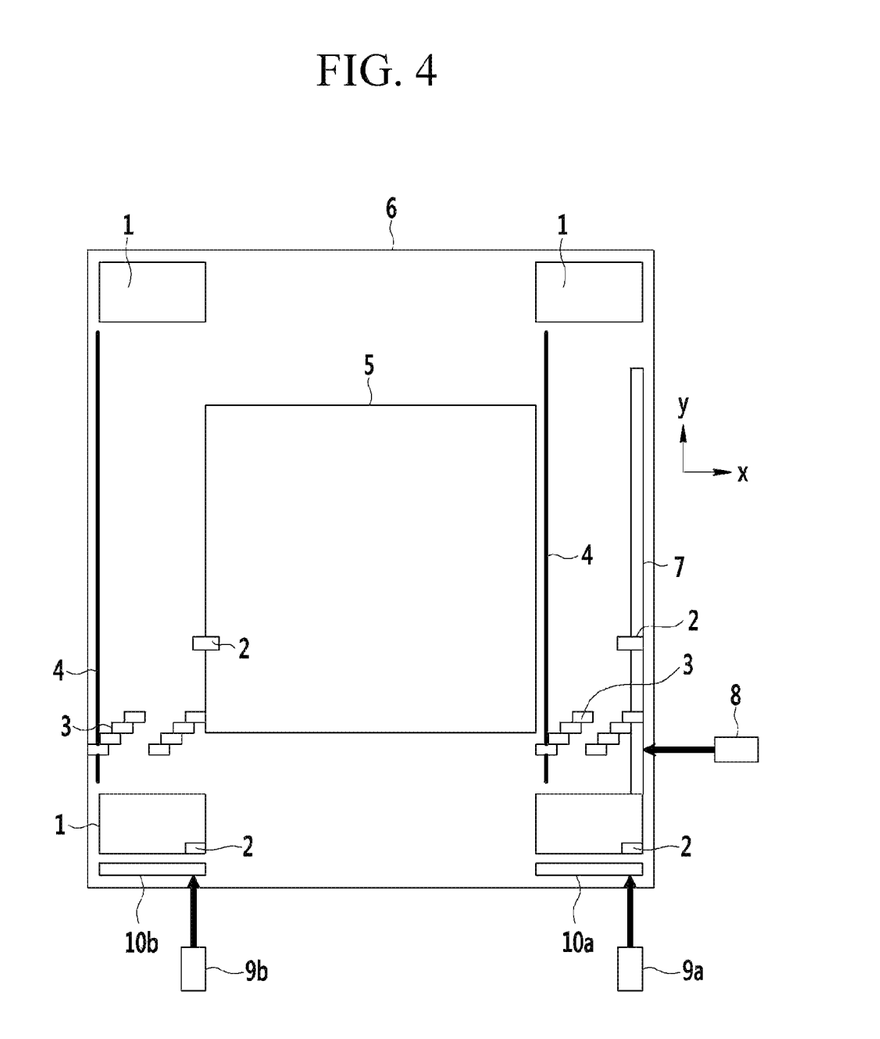

FIG. 3 and FIG. 4 are top plan views of the stage position measuring device with respect to different positions of the stage in the stage transferring device of FIG. 1 and FIG. 2 according to the invention.

Firstly, referring to FIG. 1, a working object 5 is mounted and fixed on a transferring stage 6. The working object 5 may be a substrate that is coated with a photosensitive material for exposure work or a testing object for testing work.

The 1D scale 4 faces one of a plurality of 1D scale reading heads 3. The 1D scale reading head 3 facing the 1D scale 4 may obtain the coordinate of the y-axis direction of the transferring stage 6 through the beam reflected by and returned from the 1D scale 4 after the measuring beam is irradiated to the 1D scale 4.

Simultaneously, the upper 2D encoder 1 positioned at a side of the transferring stage 6 may face the corresponding upper 2D encoder reading head 2. Here, the upper 2D encoder 1 positioned on the transferring stage 6 is described as an example. The upper 2D encoder reading head 2 facing the upper 2D encoder 1 may obtain both x and y coordinates of the transferring stage 6 in the x-y plane through the beam reflected by and returned from the 2D encoder 1 after the measuring beam is irradiated to the 2D encoder 1.

Where the 2D encoder reading head 2 obtains x and y coordinates of the transferring stage 6, one y-axis coordinate of the 2D encoder reading head 2 and the 1D scale reading head 3 may be exchanged for the other y-axis coordinate. The stage position measuring device may be configured to perform the exchange of one or more coordinate. That is, the y-axis coordinate of the 2D encoder reading head 2 may be set to be equal to the y-axis coordinate obtained by the 1D scale reading head 3.

The position of the transferring stage 6 in the x-y plane may be controlled based on the measured x-axis coordinate and the measured y-axis coordinate.

Now, referring to FIG. 3, the transferring stage 6 is moved in the y-axis direction and the work is performed on the working object. In the position shown in FIG. 3 the upper 2D encoder 1 and the upper 2D encoder reading head 2 do not face each other and the 1D scale 4 and the same 1D scale reading head 3 face each other. Accordingly, the y-axis coordinate of the transferring stage 6 is measured through the overlapping 1D scale 4 and the 1D scale reading head 3 and the y-axis position of the transferring stage 6 may be controlled through this y-axis direction moving and measurement process.

Now, referring to FIG. 4, if the transferring stage 6 is further moved in the y-axis direction, the lower 2D encoder 1 faces the corresponding lower 2D encoder reading head 2. The lower 2D encoder reading head 2 facing the lower 2D encoder 1 may obtain the x and y coordinates of the transferring stage 6 in the xy plane through the beam reflected by and returned from the 2D encoder 1 after the measuring beam is irradiated to the 2D encoder 1. Simultaneously, the coordinate of the transferring stage 6 in the y-axis direction may be obtained through the 1D scale 4 and the 1D scale reading head 3.

Once the y-axis coordinate has been obtained by the 1D scale reading head 3, and both x-axis and y-axis coordinates have been obtained by the 2D encoder reading head 2, the y-axis coordinate obtained by the 2D encoder reading head 2 may be exchanged for the y-axis coordinate of the 1D scale reading head 3. In detail, the coordinate signal relating to the y-axis coordinate of the 1D scale reading head 3 is provided to the 2D encoder reading head 2 such that the y-axis coordinate of the 2D encoder reading head 2 is converted to the y-axis coordinate of the 1D scale reading head 3.

As described above, when the 1D scale reading head 3 and the 2D encoder reading head 2 measure their respective coordinates, the 1D scale reading head 3 and the 2D encoder reading head 2 exchange a coordinate value or data with respect to a coordinate value, in detail, the y-axis coordinate value. At this time, the 1D scale reading head 3 and the 2D encoder reading head 2 measure each coordinate several times to calculate a difference in the coordinate measurements, and the difference in the coordinate measurements may be used when converting the coordinate signal. In one embodiment, for example, an average value of the differences in coordinate measurements is obtained after averaging differences between y-axis coordinate values measured several times by the 1D scale reading head 3 and the 2D encoder reading head 2 and may be used when converting the coordinate signal. As described above, if using the averaged difference between the coordinate values obtained by measuring the y-axis coordinate several times, an error that may be generated when converting the coordinate signal of the 2D encoder reading head 2 to the coordinate value of the 1D scale reading head 3 may be reduced.

After the position of the transferring stage in the x-axis direction is converted into a stepped operation, y-axis direction scanning and the work may be performed. The stepped operation in the x-axis direction includes discontinuous displacement of the stage in the x-axis, while displacement of the transferring stage 6 in the y-axis may be substantially continuous. Where the substantially continuous scanning and work in the y-axis is performed on the working object 5, converting the y-axis coordinate obtained by the 2D encoder reading head 2 to the y-axis coordinate obtained by the 1D scale reading head 3 may be realized.

As described, if the x-axis coordinate and the y-axis coordinate of the transferring stage 6 are measured by simultaneously using the 1D scale 4 and the 2D encoder 1 to control the position of the transferring stage 6, the position of the transferring stage 6 may be accurately controlled. Where multiple 1D scales 4 arranged in the x-axis direction and elongated the y-axis direction are used, a limitation on an overall travel distance of the transferring stage 6 with respect to the support 11 may be reduced. Also, when several transferring stages 6 configured to be moved in the x-axis and the y- are accumulated such as in a stacked-structure, a mass center is increased and an overall travel distance for the multiple transferring stages 6 may be relatively large. However, since one or more exemplary embodiment of the invention measures the x-axis coordinate and the y-axis coordinate of the transferring stage 6 substantially simultaneously using the 1D scale 4 and the 2D encoder 1 to control the position of the transferring stage 6, a drawback of decreased accuracy may be avoided with relating to the multiple transferring stages 6.

In the method described above, if exchanging the coordinate signal of the 1D scale reading head 3 and the 2D encoder reading head 2 is repeated several times, an accumulated error may be gradually increased. To reset the accumulated error, the y-axis interferometer laser heads 9a and 9b and the x-axis interferometer laser head 8 may be used.

However, the laser interferometer may be influenced by air pressure, temperature and/or moisture that exist in a path of the laser beam emitted from the y-axis interferometer laser heads 9a and 9b and the x-axis interferometer laser head 8. Particularly, when a moving speed of the transferring stage 6 is relatively fast, a path of the light beam of the laser interferometer is undesirably influenced such that measuring a precise coordinate may be interfered with. Accordingly, to reduce the error generated in the coordinate value measured using the y-axis interferometer laser heads 9a and 9b and the x-axis interferometer laser head 8, the x-axis bar mirror 7 and the x-axis interferometer laser head 8 may be installed or the y-axis bar mirrors 10a and 10b and the y-axis interferometer laser heads 9a and 9b may be installed to reduce a light path of the reciprocating laser beam from the x-axis interferometer laser head 8 and the y-axis interferometer laser heads 9a and 9b. Also, for the same reason, the light path of the laser beam may be enclosed by a tube (not shown) to minimize the influence on the laser beam by external air such that undesirable path changes from shaking of the laser beam by a change of the movement of the air, the pressure and/or the temperature may be minimized. Accordingly, by using the x-axis coordinate and the y-axis coordinate respectively measured by the y-axis interferometer laser heads 9a and 9b and the x-axis interferometer laser head 8 as an absolute reference position, the 1D scale reading head 3 and the 2D encoder reading head 2 may be reset, to adjust for any accumulated error described above.

The resetting of the 1D scale reading head 3 and the 2D encoder reading head 2 to reduce the error accumulated by the exchange of the measuring coordinates of the 1D scale reading head 3 and the 2D encoder reading head 2 by using the laser interferometer may be performed with a predetermined cycle. In one exemplary embodiment, for example, when movement of the transferring stage 6 is stopped, this reset process may be performed. A number of the reset process using the laser interferometer may be freely controlled, and thereby working time may be controlled.

Next, an exemplary embodiment of a method of reducing an error accumulated from the exchange of and the conversion between the measured coordinates of the 1D scale reading head 3 and the 2D encoder reading head 2 in a stage transferring device according to the invention will be described with reference to FIG. 5 and FIG. 6 along with the previously-described drawings.

Figure 5:
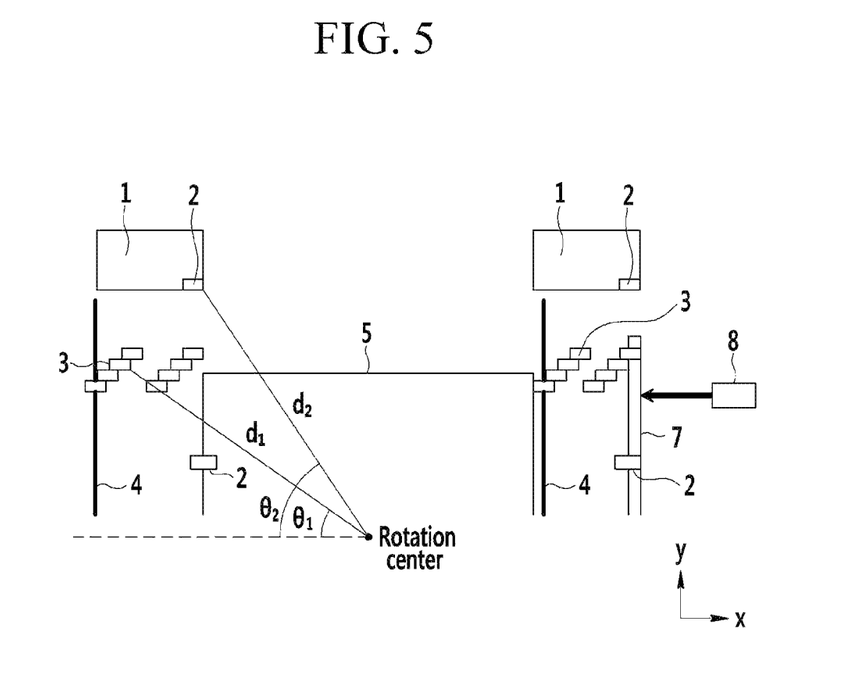
FIG. 5 and FIG. 6 are top plan views showing exemplary embodiments of a stage position measuring device with respect to a same position stage in a stage transferring device according to the invention.
Figure 6:
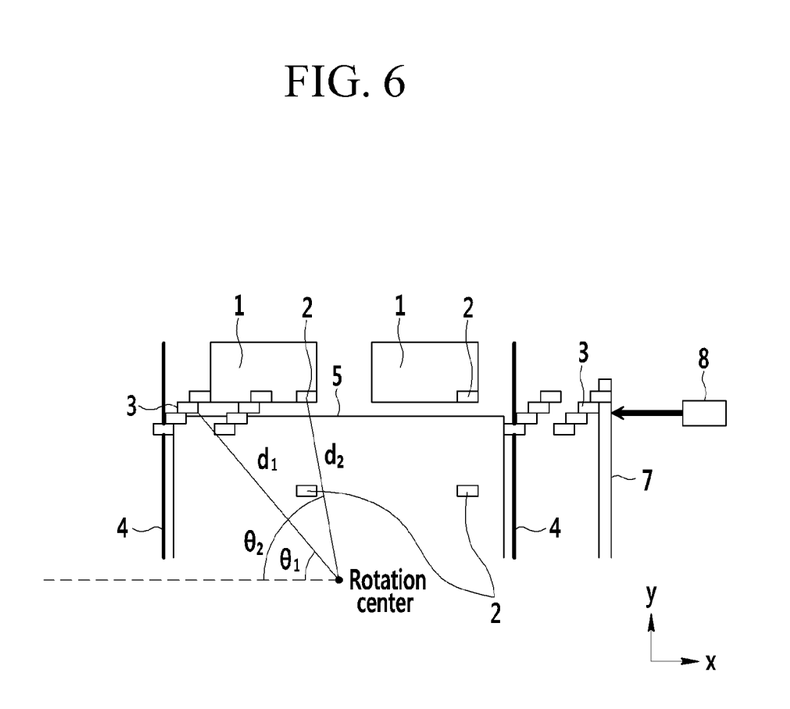

FIG. 5 and FIG. 6 are top plan views showing exemplary embodiments of a stage position measuring device with respect to a same position stage in a stage transferring device according to the invention.

When the transferring stage 6 is moved in the y-axis direction, the transferring stage 6 may be is inclined (e.g., yawed) thereby having a rotation component in the x-y plane. By this rotation component, an error may be generated when exchanging the measured coordinates of the 1D scale reading head 3 and the 2D encoder reading head 2.

When the 1D scale reading head 3 and the 2D encoder reading head 2 simultaneously measure their respective coordinates, a mechanical rotation of the stage transferring device relating to the error by the rotation component of the transferring stage 6 is as described with reference to FIG. 5.

When a rotation center is an approximate center of the transferring stage 6, a virtual line between the approximate center of a plurality of 1D scale reading heads 3 (of which one 1D scale reading head 3 overlaps the 1D scale 4) and the rotation center forms a first angle $\theta 1$ with the x-axis direction. A line between the 2D encoder reading head 2 which overlaps a 2D encoder 1 and the rotation center forms a second angle $\theta 2$ with the x-axis direction. A distance between the approximate center of a plurality of 1D scale reading heads 3 and the rotation center is the first distance d1, and a distance between the 2D encoder reading head 2 and the rotation center is the second distance d2. At this time, a difference $\Delta$ of the x-axis coordinate between the 1D scale reading head 3 and the 2D encoder reading head 2 may be calculated by Equation 1.

$$\Delta = d2(\sin \theta 2 - \sin(\theta 2 + \theta)) - d1(\sin \theta 1 - \sin(\theta 1 + \theta))$$ [Equation 1]

Here, $\theta$ is the rotation component with reference to the rotation center of the transferring stage 6. In one exemplary embodiment, for example, when d2=1400 millimeters (mm), d1=1200 mm, $\theta$=0.7 microradian (μrad), $\theta 2$=0.8 rad, and $\theta 1$=0.7 radian (rad), $\Delta$=40.3 nanometers (nm) is calculated.

Through Equation 1, it may be confirmed that main factors generating the difference of the x-axis coordinate of the 1D scale reading head 3 and the 2D encoder reading head 2 are the first distance d1 (as the distance from the rotation center to the group of 1D scale reading heads 3) and the second distance d2 (as the distance from the rotation center to the 2D encoder reading head 2). Accordingly, on the exchange or conversion of the coordinate signal between the 1D scale reading head 3 and the 2D encoder reading head 2, to reduce the difference ($\Delta$) of the x-axis coordinate of the 1D scale reading head 3 and the 2D encoder reading head 2, it is necessary to appropriately locate the 1D scale 4 and the 2D encoder 1. One example of this method will be described with reference to FIG. 6.

Referring to FIG. 6, when exchanging and converting the coordinate signals between the 1D scale reading head 3 and the 2D encoder reading head 2, the 1D scale 4 and the 2D encoder 1 may be positioned at the first distance d1 and the second distance d2 to be similar at a maximum value thereof. In detail, the 1D scale reading head 3 and the 2D encoder reading head 2 may not be fixed at the same position or overlap such that the 1D scale reading head 3 and the 2D encoder reading head 2 may be disposed separated from each other to approximately satisfy Equation 2.

$$d2(\sin \theta 2) = d1(\sin \theta 1)$$ [Equation 2]

If the 1D scale reading head 3 and the 2D encoder reading head 2 are disposed according to Equation 2, the error caused by the mechanical rotation of the stage transferring device or the rotation component of the transferring stage 6 may be minimized. In one exemplary embodiment, for example, if $\theta 2$=0.8 rad, $\theta 1$=0.7 rad and d1=1200 mm, the approximate center of the 2D encoder reading head 2 is disposed to be positioned at 1078 mm from the rotation center by Equation 2, and the error by the mechanical rotation of the stage transferring device or the rotation component of the transferring stage 6 may be minimized.

However, when a plurality of 1D scale reading heads 3 are disposed with respect to one 1D scale 4, the distance from the rotation center to the plurality of 1D scale reading heads 3 exists in plural such that the error caused by the mechanical rotation of the stage transferring device or the rotation component of the transferring stage 6 may not completely be 0. Where a group of 1D scale reading heads 3 causes the error to not be completely 0, as described above, by periodically resetting the coordinate value by using the laser interferometer, the position of the transferring stage 6 may be correctly measured and the position of the transferring stage 6 may be correctly controlled.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A stage transferring device comprising:
 a transferring stage upon which an object to be processed is mounted and which transfers the object to be processed in an x-axis direction and a y-axis direction within an x-y plane, the transferring stage comprising a rotation center at a geometric center thereof; and a stage position measuring device comprised at a same side of the mounted object in the x-direction:
fixed on a same transferring stage with the object mounted thereon,
a one-dimensional scale of which a length thereof extends in the y-axis direction; and
a two-dimensional encoder provided in plural spaced apart from opposing ends of the one-dimensional scale in the y-axis direction; and
fixed on a same support relative to which the transferring stage moves,
a one-dimensional scale reading head which is configured to overlap the one-dimensional scale, irradiate a measuring beam to the overlapped one-dimensional scale and measure a 1D y-axis coordinate of the transferring stage; and
a two-dimensional encoder reading head provided in plural spaced apart from the one-dimensional scale reading head at opposing sides of the one-dimensional scale reading head in the y-axis direction, the two-dimensional encoder reading head configured to overlap the two-dimensional encoder, irradiate a measuring beam to the overlapped two-dimensional encoder and measure a 2D x-axis coordinate and a 2D y-axis coordinate of the transferring stage,
wherein
at the same side of the mounted object in the x-direction, the two-dimensional encoder reading head measures the 2D x-axis coordinate and the 2D y-axis coordinate, simultaneously with the one-dimensional scale reading head measuring the 1D y-axis coordinate,
the stage position measuring device determines the y-axis position of the transferring stage on which the object to be processed is mounted by the simultaneously measured 2D y-axis coordinate and the 1D y-axis coordinate,
a distance between an approximate center of the one-dimensional scale reading head and the rotation center of the transferring stage is referred to as a first distance d1,
a distance between the two-dimensional encoder reading head and the rotation center of the transferring stage is referred to as a second distance d2,
an angle formed by the approximate center of the one-dimensional scale reading head with respect to the x-axis direction is referred to as a first angle θ1, and
an angle formed by the two-dimensional encoder reading head with respect to the x-axis direction is referred to as a second angle θ2, and
d2 (sinθ2) =d1 (sinθ1) when the two-dimensional encoder reading head overlaps the two-dimensional encoder.

2. The stage transferring device of claim 1, wherein
when the one-dimensional scale reading head overlaps the one-dimensional scale and the two-dimensional encoder reading head overlaps the two-dimensional encoder,
the one-dimensional scale reading head measures a first 1D y-axis coordinate simultaneously with the two-dimensional encoder reading head measuring a first 2D x-axis coordinate and a first 2D y-axis coordinate.

3. The stage transferring device of claim 2, wherein
when the two-dimensional encoder reading head does not overlap the two-dimensional encoder and the one-dimensional scale reading head overlaps the one-dimensional scale, the one-dimensional scale reading head measures a second 1D y-axis coordinate of the transferring stage.

4. The stage transferring device of claim 2, wherein
when the one-dimensional scale reading head overlaps the one-dimensional scale and the two-dimensional encoder reading head overlaps the two-dimensional encoder, the stage position measuring device sets the first 2D y-axis coordinate measured by the two-dimensional encoder reading head equal to the first 1D y-axis coordinate measured by the one-dimensional scale reading head or sets the first 1D y-axis coordinate measured by the one-dimensional scale reading head equal to the first 2D y-axis coordinate measured by the two-dimensional encoder reading head.

5. The stage transferring device of claim 4, wherein
differences between the first 1D y-axis coordinate of the one-dimensional scale reading head and the first 2D y-axis coordinate of the two-dimensional encoder reading head are measured several times, and an average value of the differences is used when the stage position measuring device sets the first 2D y-axis coordinate equal to the first 1D y-axis coordinate or sets the first 1D y-axis coordinate equal to the first 2D y-axis coordinate.

6. The stage transferring device of claim 5, further comprising
a laser interferometer which measures a position of the transferring stage in the x-y plane.

7. The stage transferring device of claim 6, wherein the laser interferometer comprises:
a y-axis bar-shaped mirror at a first edge side of the transferring stage, the first edge side elongated in the x-axis direction; and
a y-axis interferometer laser head which corresponds to the y-axis bar-shaped mirror and measures an absolute y-axis coordinate.

8. The stage transferring device of claim 7, wherein the laser interferometer further comprises:
an x-axis bar-shaped mirror at a second edge side of the transferring stage, the second edge side elongated in the y-axis direction; and
an x-axis interferometer laser head which corresponds to the x-axis bar-shaped mirror and measures an absolute x-axis coordinate.

9. The stage transferring device of claim 8, wherein the stage position measuring device resets the first 1D y-axis coordinate of the one-dimensional scale reading head and the first 2D y-axis coordinate of the two-dimensional encoder reading head by using the absolute y-axis coordinate.

10. A position measuring method of a stage, the method comprising:
mounting a working object to be processed on a transferring stage which transfers the working object in an x-axis direction and a y-axis direction within an x-y plane, the transferring stage comprising a rotation center at a geometric center thereof;
at a same side of the mounted object in the x-direction,
measuring a 1D y-axis coordinate of the transferring stage by a one-dimensional scale on the transferring stage and a one-dimensional scale reading head overlapping the one-dimensional scale;
measuring a 2D x-axis coordinate and a 2D y-axis coordinate of the transferring stage by a two-dimensional encoder reading head overlapping a two-dimensional encoder on the transferring stage, simultaneously with the one-dimensional scale reading head measuring the 1D y-axis coordinate of the transferring stage, wherein fixed at the same side of the mounted object in the x-direction, the two-dimensional encoder is provided in plural to be respectively spaced apart from opposing ends of the one-dimensional scale in the y-axis direction; and determining the y-axis position of the transferring stage on which the working object to be processed is mounted by the simultaneously measured 2D y-axis coordinate and the 1D y-axis coordinate, wherein a distance between an approximate center of the one-dimensional scale reading head and the rotation center of the transferring stage is referred to as a first distance d1, a distance between the two-dimensional encoder reading head and the rotation center of the transferring stage is referred to as a second distance d2, an angle formed by the approximate center of the one-dimensional scale reading head with respect to the x-axis direction is referred to as a first angle $\theta 1$, and an angle formed by the two-dimensional encoder reading head with respect to the x-axis direction is referred to as a second angle $\theta 2$, and d2 $(\sin\theta 2)$ =d1 $(\sin\theta 1)$ when the two-dimensional encoder reading head faces the two-dimensional encoder.

11. The method of claim 10, wherein at the same side of the transferring stage in the x-direction, when the two-dimensional encoder and the two-dimensional encoder reading head overlap each other, the one-dimensional scale reading head measures a first 1D y-axis coordinate, simultaneously with the two-dimensional encoder reading head measuring a first 2D x-axis coordinate and a first 2D y-axis coordinate.

12. The method of claim 11, wherein at the same side of the transferring stage in the x-direction, when the two-dimensional encoder reading head does not overlap the two-dimensional encoder, the one-dimensional scale reading head measures a second 2D y-axis coordinate of the transferring stage.

13. The method of claim 11, further comprising setting the first 2D y-axis coordinate of the two-dimensional encoder reading head to be equal to the first 1D y-axis coordinate of the one-dimensional scale reading head or setting the first 1D y-axis coordinate of the one-dimensional scale reading head equal to the first 2D y-axis coordinate of the two-dimensional encoder reading head, when the one-dimensional scale reading head overlaps the one-dimensional scale and the two-dimensional encoder reading head overlaps the two-dimensional encoder.

14. The method of claim 13, wherein differences between the first 1D y-axis coordinate of the one-dimensional scale reading head and the first 2D y-axis coordinate of the two-dimensional encoder reading head are measured several times, and an average value of the differences is used when the stage position measuring device sets the first 2D y-axis coordinate equal to the first 1D y-axis coordinate or sets the first 1D y-axis coordinate equal to the first 2D y-axis coordinate.

15. The method of claim 14, further comprising periodically measuring the position of the transferring stage by a laser interferometer.

16. The method of claim 15, wherein the laser interferometer comprises:

a y-axis bar-shaped mirror at a first edge side of the transferring stage, the first edge side elongated in the x-axis direction; and a y-axis interferometer laser head which corresponds to the y-axis bar-shaped mirror and measures an absolute y-axis coordinate.

17. The method of claim 16, wherein the laser interferometer further comprises:

an x-axis bar-shaped mirror at a second edge side of the transferring stage, the second edge side elongated in the y-axis direction; and an x-axis interferometer laser head which corresponds to the x-axis bar-shaped mirror and measures an absolute x-axis coordinate.

18. The method of claim 15, further comprising resetting the first 1D y-axis coordinate of the one-dimensional scale reading head and the first 2D y-axis coordinate of the two-dimensional encoder reading head by using the absolute y-axis coordinate.

\* \* \* \* \*